United States Patent [19]

Engler et al.

[11] 4,036,648

[45] July 19, 1977

[54] HIGHLY CONDUCTIVE PRINTING MEDIUM CONTAINING A HALOGENATED HYDROCARBON PHOTOACTIVATOR AND A TETRATHIAFULVALENE OR A RELATED COMPOUND THEREOF

[75] Inventors: Edward Martin Engler, Wappingers Falls; Frank Benjamin Kaufman, New York; Bruce Albert Scott, Shrub Oak, all of N.Y.

[73] Assignee: International Business Machines Corporation, Armonk, N.Y.

[21] Appl. No.: 591,992

[22] Filed: June 30, 1975

[51] Int. Cl.² ............................ G03C 1/52; G03G 5/00
[52] U.S. Cl. ........................................ 96/90 R; 96/88; 96/1.5; 96/38.4
[58] Field of Search .............. 96/88, 38.4, 1.5, 90 R, 96/115 P; 252/501

[56] References Cited

U.S. PATENT DOCUMENTS

| | | | |
|---|---|---|---|
| 3,042,519 | 7/1962 | Wainer | 96/90 R |
| 3,359,105 | 12/1967 | Wainer | 96/90 R |
| 3,765,888 | 10/1973 | Sano et al. | 96/90 R |
| 3,935,009 | 1/1976 | Crommentuyn et al. | 96/1.5 |
| 3,936,307 | 2/1976 | Asakawa et al. | 96/88 |

*Primary Examiner*—Won H. Louie, Jr.
*Attorney, Agent, or Firm*—Hansel L. McGee; William S. Robertson

[57] ABSTRACT

A method of optically printing conductive characters using charge transfer compounds is provided. The method is characterized by depositing an organic π electron donor compound dissolved in a halogenated hydrocarbon (halocarbon) on a suitable substrate and selectively exposing the so coated substrate to actinic radiation to obtain a permanent, highly conductive, image.

11 Claims, 1 Drawing Figure

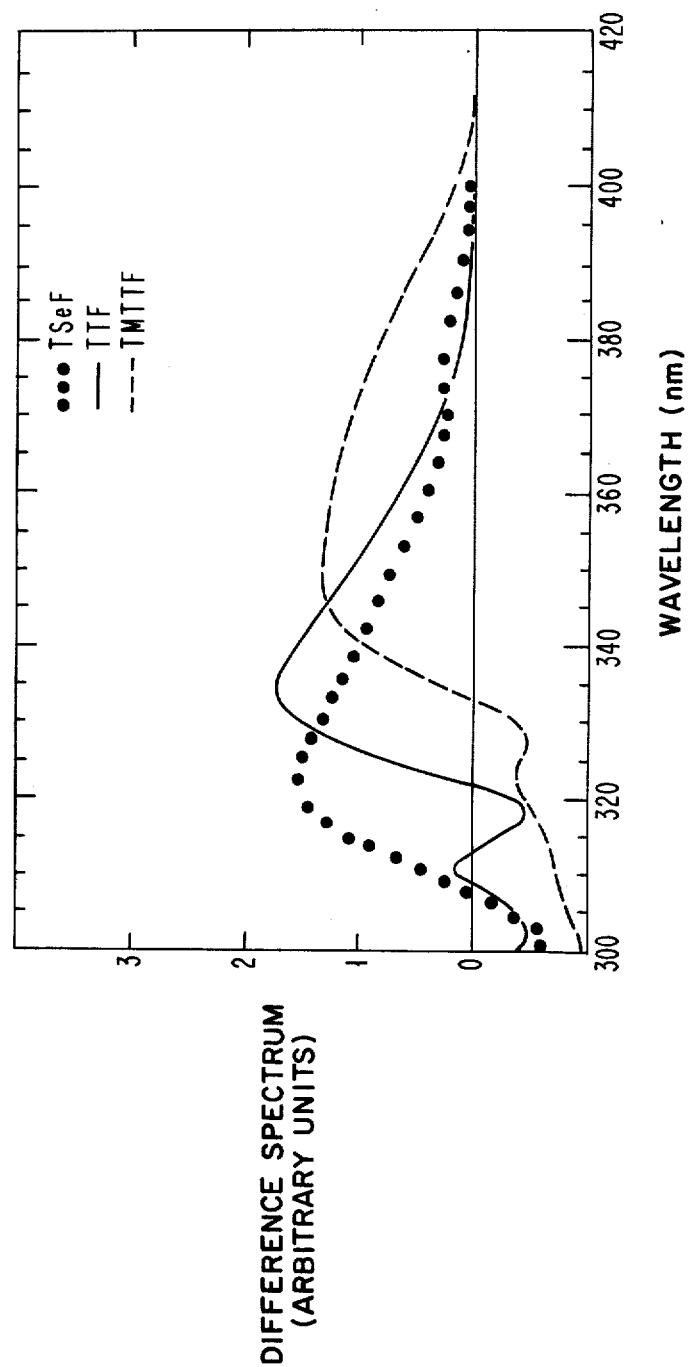

HIGHLY CONDUCTIVE PRINTING MEDIUM CONTAINING A HALOGENATED HYDROCARBON PHOTOACTIVATOR AND A TETRATHIAFULVALENE OR A RELATED COMPOUND THEREOF

BACKGROUND OF THE INVENTION

The present invention provides a method of and materials for optically printing highly conductive images.

Most techniques for the deposition of high electrical conductivity lines or characters involve the depositing of metals onto a substrate, or by direct printing using highly conducting metallic dispersions in a suitable vehicle. Other methods used include thermal decomposition of organometallic compounds and electrochemical deposition.

More recently considerable interest has been directed towards highly conducting organic "charge transfer" compounds. In particular, emphasis has been placed on low ionization potential organic donors and their charge transfer salts formed by oxidation with organic acceptors such as 7,7,8,8, tetracyanoquinodimethane (TCNQ).

The most conducting organics known are the 1:1 TCNQ salts of the fulvalene-type donor compounds such as tetrathiafulvalene (TTF), tetraselenafulvalene (TSeF), cis/transdiselenadithiafulvalene (DSeDTF) and cis/trans dimethyl tetrathiafulvalene (ATTF). The composition (TTF) (TCNQ), for example, shows a conductivity $\sigma(RT) = 500(\Omega\text{-cm})^{-1}$ at room temperature. The isomorphic selenium analog, (TSeF) (TCNQ), the subject of commonly assigned patent application Ser. No. 477,553, shows an even larger metallic conductivity, e.g., $\sigma \approx 800(\Omega\text{-cm})^{-1}$ at room temperature.

In this regard see British Pat. No. 1,382,748, U.S. Pat. No. 3,252,061, U.S. Pat. No. 3,781,281, U.S. Pat. No. 3,799,814, U.S. Pat. No. 3,162,641, publications to L. Russell Melby, entitled "Substituted Quinodimethans", *Canadian Journal of Chemistry*, Vol,43 (1965), to L. Russell Melby et al., entitled "Substituted Quinodimethans II", J. Amer. Chem, Soc., vol. 84 (1960); to F. Wudl et al., entitled "Electrical Conductivity by the Bis, 1,3-dithiole-Bis-1,3 dithiolium System", J. Amer. Chem. Soc., Vol. 94.2 (Jan. 26, 1972); to F. Wudl et al., entitled "Bis-1,3-ditholium Chloride: An Unusually Stable Organic Radical Cation", *Chemical Communications*, p.1453 (1970); to Jerome H. Perlstein et al., entitled "Electron Transport and Magnetic Properties of New Highly Conducting TCNQ Complexes", *AIP Conference Proceedings*, No. 10, part 2 (1972).

SUMMARY OF THE INVENTION

In the figures:

The FIGURE depicts U.V. difference spectra for three charge transfer compounds used in the present invention.

DESCRIPTION OF THE INVENTION

The present invention teaches the optical printing of highly conductive lines or characters, wherein organic $\pi$-donors in halogenated solvents are deposited onto substrates and subsequently exposed to actinic radiation to give a highly conducting, colored, image. The present invention comprises the steps:

1. Depositing an organic $\pi$-electron donor compound dissolved in a halocarbon onto a substrate, 2. Exposing the coated substrate to actinic radiation in a predetermined pattern; and 3. removing said halocarbon.

The compositions used in the present invention are of the type $(\text{Donor})\chi_n$ where the donor is typically selected from TTF, TSeF, DSeDTF, and their substituted derivatives, where $\chi$ is selected from F, Br, Cl and I and $n < 1$. These compositions have conductivities in the range $\sigma(RT) \approx 10\text{-}500\ (\Omega\text{-cm})^{-1}$ in single crystal form. X-ray crystallographic studies indicate that the $(\text{Donor})\chi_n$ structures consist of donor stacks with intermolecular spacings comparable to that in (TTF)(TCNQ). The compositions are non-stoichiometric. The non-stoichiometric compositions range between $0.5 < n < 1$ and are a necessary condition for high conductivity.

These compositions can be deposited upon a variety of substrate materials, e.g., glass, ceramics, polymeric materials, paper and the like. When deposited on such insulating materials a large ($10^8$–$10^{16}$) difference in conductivity is created between the printed line or character and its supporting, insulating matrix.

A feature of the present invention is the discovery that illumination of a donor complex in its charge transfer band (e.g., as shown in FIG. 1) results in the photoconversion of the donor to its highly conducting $(\text{Donor})\chi_n$ composition. For example, it is found that the following general reaction occurs when a donor compound such as TTF dissolved in $CCl_4$ is exposed to actinic radiation:

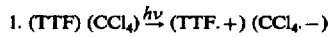

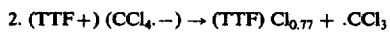

Light of the wavelength in the charge transfer (CT) band spectral region, typically 3000–4000A, of the specific complex is found to be active in the photo-oxidation of the donors to $(\text{Donor})\chi_n$ compounds. Activation may also occur outside of the CT band when sensitizers are used. Such sensitizers include visible light absorbing dyes such as Rhodamine B, Rose Bengal, methylene blue, and aromatic-type hydrocarbons such as anthracene, naphthalene, pyrene and the like. The $.CCl_3$ free radicals generated as a result of the above reaction react further with solvent to produce higher halocarbons and free halogen atoms. Thus, the overall photochemical process has considerable gain, or amplification, e.g., (a Quantum efficiency $>> 1$), because the free halogen formed can oxidize unreacted donor molecules.

As an example of the use of these conducting photomaterials, highly conducting characters are printed with the use of ultraviolet radiation. Solutions of a neutral donor in a halocarbon solvent are applied directly to a non-special paper, for example, typing paper, covered with a mask and then exposed to ultraviolet radiation. Excess solvent evaporates within seconds, leaving a clean, dry image on a surrounding background of neutral donor. The unreacted donor can be stripped off if desired by dissolution in any number of non-polar solvents such as alcohols, ethers, $CH_2Cl_2$, dioxane, hexane, benzene, and the like, without removing the printed matter. Printing on various substrates is direct, requiring no development procedure following the formation of the image. In addition, the light source may be broad band. For example, sunlight can be used so long as there is a U.V. component, i.e., wavelengths between 3000–4000A.

Colored characters can also be printed because the intrinsic absorption spectrum of the deposited donor halide compound can be shifted by appropriate chemical modifications such as additions of substituents on the donor or replacement of the ring heteroatoms.

Referring to the FIGURE it can be seen that by employing appropriate substitution on tetrathiafulvalene, the absorption characteristics of the coated substrate, and the color and conductivity of the printed image can be varied. For example, tetrathiafulvalene has its change transfer absorption maximum at 335nm and is deposited to give a red colored image. Substitution of selenium for sulfur to give tetraselenafulvalene changes the charge transfer absorption maximum to 320nm and gives a green image. Replacement of the hydrogens in tetrathiafulvalene also alters the absorption maximum and color of deposited image. For example, methyl substitution to give tetramenthyltetrathiafulvalene changes the charge transfer absorption to 350nm and results in a brown image.

Moreover, since each system will have a specific CT absorption range, it is possible to deposit multicolored arrays from a multicomponent solution by selective excitation in each respective component CT band.

The relatively high conductivities of the printed characters can be exploited in electrical character sensing or a non-optical reproduction process using masters printed in the above manner. Moreover, since the donor $X_n$ compositions are paramagnetic solids, their magnetic properties may be useful in magnetic sensing applications.

In operation, this invention may be effected by using donors of the empirical formula $C_6H_4X_4R_4$ and having the structural formula

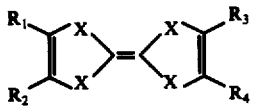

where X=O, S, Se and Te or any combination thereof. The R groups may be any organic substituent including alkyls, such as methyl and ethyl, phenyls, substituted phenyls, —SCH$_3$, —CO$_2$ME, halogen, fused cyclics in which the substituent effectively connects R1 with R2 and R3 with R4, e.g.

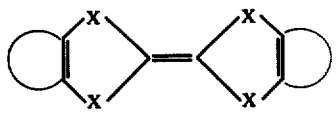

The following fused rings, such as cyclopentene, cyclohexene, benzene, furan, thiophene, dihydrofuran and dihydrothiophene, and derivatives thereof can be used. In addition, tetrathiatetracene compounds, e.g.

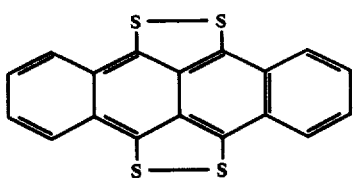

and their derivatives are also suitable for the purpose of this invention. In general, organic π-electron donors having low ionization potentials and which forms self-stacking conducting transfer salts can be used.

The halocarbon complexing agent may be present as a component in the solution with other organic solvents, for example, chloroform, acetone, alcohol, chlorobenzene, etc., or may comprise the solvent entirely. Concentrations of the donor and halocarbon may range widely with the optimum concentration being $10^{-5}$ molar to 1 molar in donnor concentration. A large excess of the halocarbon is preferred. Maximum sensitivity is obtained by illuminating the charge transfer composition in the CT bands of the particular compositions. As indicated above, different colors can be deposited by changing the donor system. For example, TTF yields a dark red image, TSeF provides a green image and cis/-trans dimethyl TTF provides a pink image. Generally, the color obtained is characteristic of the cation of the donor chosen.

EXAMPLES

The following examples are by way of illustration and not by way of limitation.

EXAMPLE 1

A solution containing 1 mg/ml of TTF in CCl$_4$ is prepared and stored in the dark. An aliquot of 0.5 ml of this solution is applied to a 10 cm$^2$ area of ordinary typing paper and covered with a mask. The mask is then illuminated with low intensity (0.5 watts/cm$^2$) ultraviolet radiation at 3650A for one minute, removed, and the excess CCl$_4$ allowed to evaporate. A red conducting image was deposited on the paper with a resolution better than 20 lines per millimeter. The yellow background remaining as the result of unreacted TTF is removed by immersing the image in benzene for several seconds and permitting it to air dry.

EXAMPLE 2

The conditions of Example 1 are repeated on a smooth glass substrate. A red conducting image with a resolution better than 30 lines/mm is obtained.

EXAMPLE 3

Example 1 was repeated but the exposure is made for only five seconds with the paper mounted on a flat glass backing plate. The mask-paper-glass plate sandwich was then placed in the dark. It was removed after 10 minutes and excess CCl$_4$ is evaporated. A dull red image resulted on the paper, illustrating the inherent gain of the process.

EXAMPLE 4

The conditions of Example 1 are repeated but with a solution consisting of 0.01 molar TTF and one molar CCl$_4$ in CHCl$_3$, with similar results.

EXAMPLE 5

A solution containing 0.2 mg/ml of TTF and 1 molar CBr$_4$ in CHCl$_3$ is prepared. An aliquot of 0.5 ml of this solution is applied to a 10 cm$^2$ area of ordinary typing paper as in the previous examples. The paper is masked and illuminated with a low intensity (0.5 watts/cm$^2$) ultraviolet light at 3650A for one minute. Excess solvent and CBr$_4$ is evaporated, leaving a dark red conducting image. The composition of the image was analyzed and found to be TTF Br$_{0.71}$.

EXAMPLE 6

A solution containing 0.8 mg/ml of TSeF and 1 molar $CBr_4$ in $CHCl_3$ is prepared. An aliquot of this solution as in the above samples is coated on a substrate and exposed to radiation as in the above examples. A dark green conducting image is obtained. Analysis of the composition of the image showed the image to be comprised of $(TSeF)Br_{0.81}$.

EXAMPLE 7

Under similar conditions to Example 1, but using a solution consisting of 2 mg/ml of cis/trans-dimethyl TTF in $CCl_4$, a pink conducting image is obtained. Analysis shows that the image is comprised of $(cis/trans\text{-dimethyl TTF})Br_{0.67}$.

EXAMPLE 8

The conditions of Example 1 are repeated using tetraselenafulvalene as the $\pi$-electron donor. A green conducting image was deposited with a resolution of better than 20 lines/mm.

EXAMPLE 9

The conditions of Example 1 are repeated using diselenadithiafulvalene as the $\pi$-electron donor. A purple-blue conducting image was obtained with a resolution of better than 7 lines/mm.

EXAMPLE 10

The conditions of Example 1 are repeated using cis/-transdimethyldiselenadithiafulvalene as the $\pi$-electron donor. A grey-blue conducting image was deposited with a resolution of better than 20 lines/mm.

EXAMPLE 11

The conditions of Example 1 are repeated using tetramethyltetrathiafulvalene as the $\pi$-electron donor. A brown conducting image is deposited with a resolution of better than 20 lines/mm.

EXAMPLE 12

The conditions of Example 1 are repeated using hexamethylenetetrathiafulvalene(HMTTF)

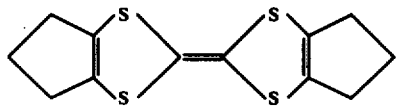

as the $\pi$-electron donor in a solution of 25% chlorobenzene in carbon tetrachloride. A light brown conducting image is deposited with a resolution of better than 20 lines/mm.

EXAMPLE 13

The conditions of Example 1 are repeated using hexamethylenetetraselenafulvalene

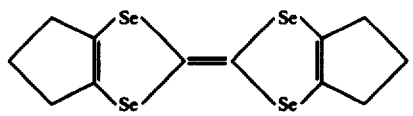

as the $\pi$-electron donor in a solution of 25% chlorobenzene in carbon tetrachloride. A conducting olive-green image is deposited with a resolution of better than 20 lines/mm.

EXAMPLE 14

The conditions of Example 1 are repeated using tetrathiatetracene as the $\pi$-electron donor. A conducting, pink image is deposited.

It has been found that the resolution of the above technique on porous substrates such as paper is limited only by the porosity and fiber size of the paper. The colored conducting image occurs as very fine, needle-like crystals much less than 1 micron in length which become enmeshed tightly within the matrix of fibers. Measured electrical resistances on the paper range from $10^4$ to $10^5$ ohms/cm compared to greater than $10^{12}$ ohms/cm in untreated paper.

A major advantage of this invention is the ability to produce high conductivity lines or characters in any specific array desired with high resolution using a non-contact printing process possessing quantum gain. Moreover, the method is rapid as there is no development step required after the deposition of the characters other than the evaporation of excess solvent. The invention also has the advantage that excess unreacted $\pi$-electron donor compounds can be left on the matrix after solvent evaporation and can be reutilized in a subsequent step. For example, upon reabsorbing the halocarbon solvent into the matrix at a later time additional printing can be produced by masking the unreacted donor regions and exposing them to U.V. light.

We claim:

1. A highly conductive printing medium comprising a substrate having disposed thereon a layer of an organic $\pi$-electron donor compound dissolved in a halocarbon capable in a complex with said organic $\pi$-electron donor compound of generating a free radical upon exposure to actinic radiation said medium being sensitive to actinic radiation, said organic $\pi$-electron donor compound having the emperical formula $C_6H_4X_4R_1R_2R_3R_4$ and the structural formula,

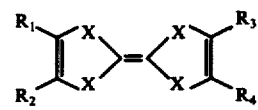

where X is selected from the group consisting of O, S, Se and Te and $R_1$, $R_2$, $R_3$, and $R_4$ is an organic substituent, selected from the group consisting of hydrogen, an alkyl group, halogen, $CO_2Me$, phenyl groups, substituted phenyl groups and fused cyclics and substituted fused cyclics selected from the groups consisting of cyclopentene, cyclohexene, benzene, furan, thiophene, dihydrofuran and dihydrothiophene.

2. A highly conductive printing medium according to claim 1 wherein said halocarbon is selected from the group consisting of $CCl_4$, $CBr_4$, $CI_4$ and $CF_4$.

3. A highly conductive printing medium according to claim 2 wherein said organic $\pi$-electron donor compound is tetrathiafulvalene.

4. A highly conductive printing medium according to claim 2 wherein said organic $\pi$-electron donor compound is tetraselenafulvalene.

5. A highly conductive printing medium according to claim 2 wherein said organic $\pi$-electron donor compound is cis/trans-dimethyltetrathiafulvalene.

6. A highly conductive printing medium according to claim 2 wherein said organic π-electron donor compound is cis/transdiselenadithiafulvalene.

7. A highly conductive printing medium according to claim 2 wherein said organic π-electron donor compound is hexamethylenetetrathiafulvalene.

8. A highly conductive printing medium according to claim 2 wherein said organic π-electron donor compound is hexamethylenetetraselenafulvalene.

9. A highly conductive printing medium according to claim 2 wherein said organic π-electron donor compound is dimethyldiselenadithiafulvalene.

10. A highly conductive printing medium according to claim 2 wherein said organic π-electron donor compound is tetramethylitetrathiafulvalene.

11. A highly conductive printing medium according to claim 2 wherein said organic π-electron donor compound is present in from about $10^{-5}$ to 1 molar in said halocarbon.

* * * * *